(12) United States Patent
Choi et al.

(10) Patent No.: US 8,278,648 B2
(45) Date of Patent: Oct. 2, 2012

(54) FABRICATION METHOD FOR AN ORGANIC THIN FILM TRANSISTOR SUBSTRATE

(75) Inventors: Tae Young Choi, Seoul (KR); Bo Sung Kim, Seoul (KR); Keun Kyu Song, Gyeonggi-do (KR); Seung Hwan Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 16 days.

(21) Appl. No.: 11/781,109

(22) Filed: Jul. 20, 2007

(65) Prior Publication Data

US 2008/0017851 A1    Jan. 24, 2008

(30) Foreign Application Priority Data

Jul. 20, 2006  (KR) .................. 10-2006-0068041

(51) Int. Cl.
*H01L 29/08*    (2006.01)
*H01L 51/10*    (2006.01)
(52) U.S. Cl. ....... 257/40; 257/59; 257/88; 257/E51.005; 438/99
(58) Field of Classification Search .............. 257/40; 438/30
See application file for complete search history.

(56) References Cited

U.S. PATENT DOCUMENTS

| | | | |
|---|---|---|---|
| 6,271,062 B1 * | 8/2001 | Nakata et al. | 438/151 |
| 6,551,717 B2 * | 4/2003 | Li et al. | 428/447 |
| 6,853,405 B2 * | 2/2005 | Lee | 349/39 |
| 2006/0147650 A1 * | 7/2006 | Park | 428/1.1 |
| 2007/0114524 A1 * | 5/2007 | Oh et al. | 257/40 |

FOREIGN PATENT DOCUMENTS

| | | |
|---|---|---|
| JP | 2002-359374 | 12/2002 |
| JP | 2005-302893 | 10/2005 |
| KR | 2002-92242 | 12/2002 |
| KR | 2005-023012 | 3/2005 |

OTHER PUBLICATIONS

English Abstract for Publication No. JP 2005-302893.
English Abstract for Publication No. KR 2005-023012.
English Abstract for Publication No. JP 2002-359374.
English Abstract for Publication No. KR 2002-92242.

* cited by examiner

*Primary Examiner* — Ha Tran T Nguyen
*Assistant Examiner* — Raj R Gupta
(74) *Attorney, Agent, or Firm* — Innovation Counsel LLP (57) ABSTRACT

An organic thin film transistor (TFT) substrate with a simplified fabrication process is disclosed. The TFT substrate includes a gate line and a data line and an organic TFT connected to the gate line and the data line. The gate line and the data line define a pixel region where a pixel electrode is formed. A first contact portion connects the data line to the organic TFT, and a second contact portion connects the pixel electrode to the organic TFT. A passivation layer covers the organic TFT. The organic TFT substrate also includes a bank insulating layer with a first contact hole for connecting the first contact portion to the organic TFT, a second contact hole for connecting the second contact portion to the organic TFT, a first sub bank defining a location of the gate insulating layer, and a second sub bank defining a location of the passivation layer.

20 Claims, 6 Drawing Sheets

FABRICATION METHOD FOR AN ORGANIC THIN FILM TRANSISTOR SUBSTRATE

CROSS-REFERENCE TO RELATED APPLICATION

This application claims priority to and the benefit of Korean Patent Application No. 2006-68041 filed on Jul. 20, 2006, the disclosure of which is incorporated herein by reference in its entirety.

BACKGROUND OF THE INVENTION

1. Field of the Invention

The present invention relates to an organic thin film transistor (TFT) substrate and, more particularly, to a simplified fabrication process for an organic TFT substrate in which two banks for forming a gate insulating layer, an organic semiconductor layer, and a passivation layer are formed by a single bank insulating layer forming process.

2. Description of the Related Art

Typically, a liquid crystal display (LCD) device has liquid crystal cells arranged in a matrix on a liquid crystal panel. The LCD device displays an image by making each of the liquid crystal cells adjust its orientation according to a signal. The orientation of the liquid crystal cells affects light transmissivity through the cells.

A thin film transistor (TFT) is provided for each liquid crystal cell as a switching element, so that each liquid crystal cell is independently supplied with a video signal. An active layer of the TFT may be formed of an amorphous silicon (amorphous-Si) layer or a poly silicon (poly-Si) layer.

The amorphous silicon layer or the poly silicon layer is formed by a complicated fabricating process that entails deposition, photolithography, and etching, leading to a high fabricating cost.

To reduce the cost of preparing an LCD device, efforts have been directed to developing an organic TFT that uses an active layer that can be formed by a simple printing process.

The organic semiconductor layer of the organic TFT overlaps a gate electrode with a gate insulating layer interposed therebetween and is protected by a passivation layer formed on the organic semiconductor layer. In fabricating the organic TFT, the gate insulating layer, the organic semiconductor layer and the passivation layer may be formed by using a printing process.

In order to form the gate insulating layer, the organic semiconductor layer and the passivation layer at their exact locations, the bank for defining the location of the gate insulating layer and the bank for defining the locations of the organic semiconductor layer and the passivation layer are separately formed.

However, a bank insulating layer is formed by using a photo process that is complicated and expensive, and a process for forming the bank insulating layer is performed at least twice to fabricate the conventional organic TFT substrate.

In addition, the conventional organic TFT has a large contact resistance between source and drain electrodes (which are made of an inorganic material) and the organic semiconductor layer (which is made of an organic material) due to a difference in their work functions, and the large contact resistance causes degradation of electrical characteristics of the organic TFT.

SUMMARY OF THE INVENTION

The present invention solves the aforementioned problems associated with conventional devices by providing an organic TFT substrate in which a bank for forming the gate insulating layer, the organic semiconductor layer, and the passivation layer is formed by a single bank insulating layer forming process.

In one aspect, the present invention provides an organic thin film transistor (TFT) substrate that includes: a gate line formed on a substrate; a data line formed substantially perpendicularly to the gate line, the gate line defining a pixel region together with the data line; an organic TFT connected to the gate line and the data line; a first contact portion for connecting the data line to the organic TFT; a pixel electrode formed in the pixel region; a second contact portion for connecting the pixel electrode to the organic TFT; and a bank insulating layer including a first contact hole through which the first contact portion is connected to the organic TFT, a second contact hole through which the second contact portion is connected to the organic TFT.

In another aspect, the present invention provides a method for fabricating an organic thin film transistor (TFT) substrate that includes: forming a gate line, a gate electrode connected to the gate line, and first and second contact portions arranged across the gate electrode from each other on a substrate; forming a bank insulating layer including a first contact hole extending to an end of the first contact portion adjacent to the gate electrode, a second contact hole extending to an end of the second contact portion adjacent to the gate electrode, a first line hole, and a second line hole; forming a gate insulating layer in the first line hole; forming a data line extending substantially perpendicularly to the gate line and connected to one end of the first contact portion, a source electrode connected to the first contact portion through the first contact hole, a drain electrode facing the source electrode and connected to the second contact portion through the second contact hole, and a pixel electrode connected to the second contact portion; forming an organic semiconductor layer on the source and drain electrodes and the gate insulating layer; and forming a passivation layer in the second line hole.

The bank insulating layer is formed to have a step portion by using any one of a slit mask and a half-tone mask.

The gate insulating layer, the organic semiconductor layer and the passivation layer are formed by using an ink jet technique.

The bank insulating layer is formed of an organic material containing fluorine.

In the step for forming the bank insulating layer, the bank insulating layer is plasma-processed to have a low affinity to the passivation layer after the first line hole is formed.

In the step for forming the organic semiconductor layer, a surface of the bank insulating layer is plasma-processed by using a $CF_4$ gas or a $SF_6$ gas to have a low affinity to the organic semiconductor layer before the organic semiconductor layer is formed and after the source and drain electrodes are formed.

The source and drain electrodes are formed to be isolated in the second line hole.

The pixel electrode and the source and drain electrodes are simultaneously formed by patterning a single transparent conductive material layer.

BRIEF DESCRIPTION OF THE DRAWINGS

The above and other features of the present invention will be described in reference to certain exemplary embodiments thereof with reference to the attached drawings in which.

DETAILED DESCRIPTION OF THE EMBODIMENT(S)

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 1:
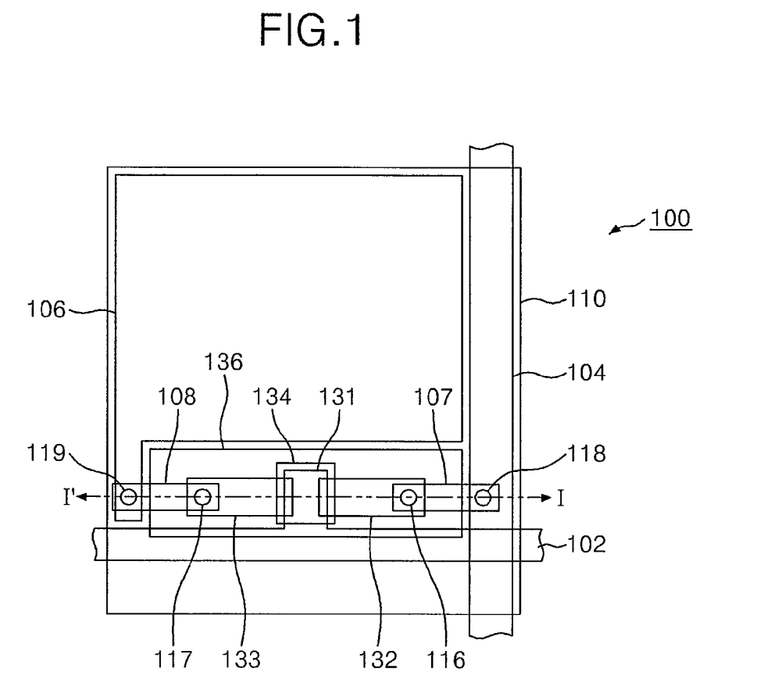
FIG. 1 is a plan view illustrating an organic TFT substrate according to an exemplary embodiment of the present invention.
Figure 2:
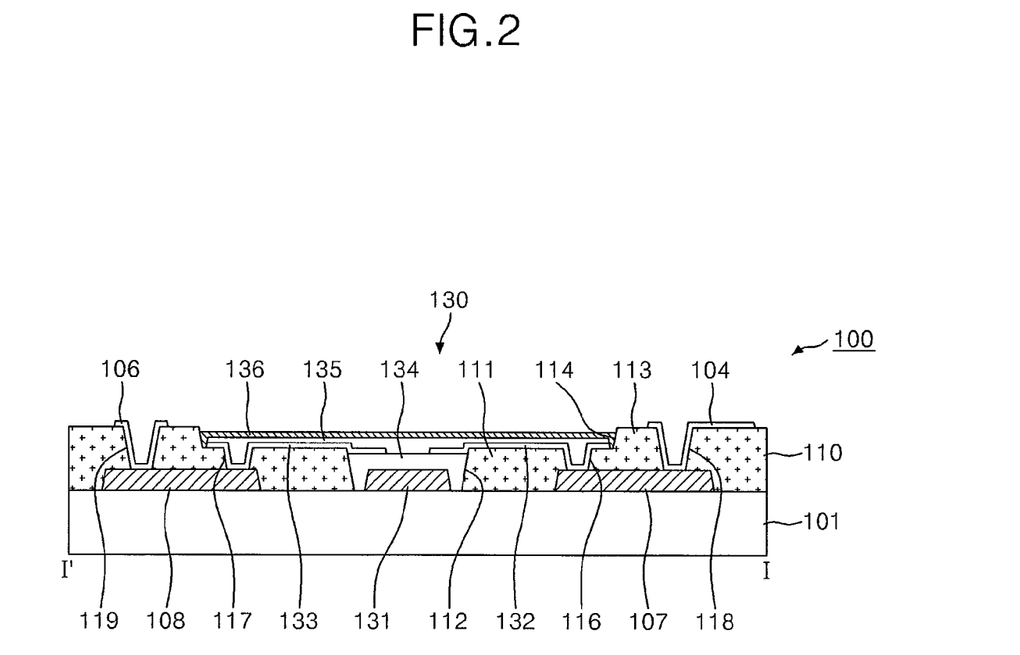
FIG. 2 is a cross-sectional view taken along the line I-I' of FIG. 1.

FIG. 1 is a plan view illustrating an organic TFT substrate 100 according to an exemplary embodiment of the present invention. FIG. 2 is a cross-sectional view taken along line I-I' of FIG. 1.

Referring to FIGS. 1 and 2, the organic TFT substrate 100 has a gate line 102 and a data line 104 formed on a substrate 101. The gate line 102 and the data line 104 extend substantially perpendicularly to each other and are separated by an insulating layer interposed between them. The organic TFT substrate 100 also has an organic TFT 130 formed at a crossing area of the gate line 102 and the data line 104, a pixel electrode 106 formed in a pixel region defined by the gate line 102 and the data line 104, a first contact portion 107 providing a contact between the organic TFT 130 and the data line 104, and a second contact portion 108 providing a contact between the pixel electrode 106 and the organic TFT 130.

The gate line 102 supplies a scan signal from a gate driver (not shown), and the data line 104 supplies a pixel signal from a data driver (not shown). The gate line 102 and the data line 104 define each pixel region with a bank insulating layer 110 interposed therebetween.

The organic TFT 130 applies a pixel signal that is supplied to the data line 104 to the pixel electrode 106 in response to the scan signal from the gate line 102. To this end, the organic TFT 130 includes a gate electrode 131 connected to the gate line 102, source and drain electrodes 132 and 133 arranged across the gate electrode 131 from each other, and an organic semiconductor layer 135. The organic semiconductor layer 135 has a channel formed between the source and drain electrodes 132 and 133 and is positioned over the gate electrode 131 with a gate insulating layer 134 interposed between the gate electrode 131 and itself.

The gate electrode 131 is exposed by a first line hole 112 arranged in a first sub bank 111. The source and drain electrodes 132 and 133 are formed of a conductive material partially overlapping the gate electrode 131. One part of the source electrode 132 is connected to a first contact portion 107 through a first contact hole 116 formed in the bank insulating layer 110, and one end of the drain electrodes 133 is connected to a second contact portion 108 through a second contact hole 117 formed in the bank insulating layer 110. The source and drain electrodes 132 and 133 are formed within a second line hole 114 arranged in the second sub bank 113.

The source and drain electrodes 132 and 133 are preferably made of a transparent conductive material such as indium tin oxide (ITO), tin oxide (TO), indium zinc oxide (IZO), and indium tin zinc oxide (ITZO). The source and drain electrodes 132 and 133 are made of the transparent conductive material to allow the light emitted from a backlight pass through the source and drain electrodes 132 and 133 and reach the organic semiconductor layer 135 formed on the source and drain electrodes 132 and 133. When the organic semiconductor layer 135 is radiated, a photoelectric current flows in the organic semiconductor layer 135, and a contact resistance between the organic semiconductor layer 135 and the source and drain electrodes 132 and 133 is reduced. A low contact resistance between the organic semiconductor layer and the electrodes results in the transistor having improved electric characteristics.

A channel area of the organic semiconductor layer 135 defined between the source and drain electrodes 132 and 133 is shielded from light by the gate electrode 131 made of a non-transparent material, and thus the photoelectric current does not flow through the channel area. Thus, the channel area of the organic semiconductor layer 135 does not affect the operation of the transistor.

The organic semiconductor layer 135, as shown in FIGS. 1 and 2, is formed to cover the source and drain electrodes 132 and 133 and the gate insulating layer 134. In this exemplary embodiment of the present invention, since the organic semiconductor layer 135 is used, the gate insulating layer 134 is formed of an organic gate insulating layer. In this exemplary embodiment of the present invention, the pixel electrode 106 is separated from the drain electrode 133. Thus, the possibility of the organic semiconductor layer 135 overflowing to the pixel electrode 106 through the drain electrode 133 during deposition is significantly reduced.

The organic semiconductor layer 135 is made of an organic semiconductor material such as pentacene, tetracene, anthracene, naphthalene, α-6T, α-4T, perylene and its derivation, rubrene and its derivation, coronene and its derivation, perylene tetracarboxylic diimide and its derivation, perylene-tetracarboxylic dianhydride and its derivation, phthalocyanine and its derivation, naphthalene tetracarboxylic diimide and its derivation, naphthalene tetracarboxylic dianhydride and its derivation, conjugated polymer containing substituted or non-substituted thiophene, and conjugated polymer containing substituted fluorine.

The organic TFT 130 is protected by the organic passivation layer 136. The organic passivation layer 136 is formed parallel to the gate line 102 formed in the second line hole 114 formed in the second sub bank 113. The organic passivation layer 136 formed in the second line hole 114 is formed to cover a peripheral region of the organic TFT 130 as well as the organic TFT 130 itself. In particular, the organic passivation layer 136 is formed to cover an interface between each of the source and drain electrodes 132 and 133 and the organic semiconductor layer 135, so that it prevents the organic semiconductor layer 135 from being damaged by any moisture or chemical that infiltrates through the interface between each of the source and drain electrodes 132 and 133 and the organic semiconductor layer 135 during fabrication. The organic passivation layer 136 formed in the second line hole 114 provides an advantage in that it allows the use of an ink jet device during fabrication. The process margin of an ink jet device is larger compared to the conventional organic passivation layer formed in a dot unit to cover only the TFT, leading to a simple fabricating process.

The bank insulating layer 110 has step portions for defining or forming the first and second line holes 112 and 114. That is, the first line hole 112 exposing the gate electrode 131 and a peripheral region of the gate electrode 131 is formed by the first sub bank 111, and the second line hole 114 exposing the organic TFT 130 and the peripheral region of the organic TFT 130 is formed by the second sub bank 113. As shown in FIG. 2, the second sub bank 113 is formed at a location farther away from the substrate 101 than the first sub bank 111. The first and second line holes 112 and 114 extend parallel to the gate line 102.

The bank insulating layer 110 is preferably formed of a fluorine-based organic material layer. The fluorine-based organic material layer has an advantage of selectively forming the organic insulating layer or the organic semiconductor layer in a desired region excluding the bank insulating layer because it has a low affinity to the organic insulating layer or the organic semiconductor layer. Here, "affinity" indicates a degree by which different materials want to stay adhered to each other. That is, a high affinity means that two materials would strongly adhere to each other, and a low affinity means that two materials would adhere to each other weakly at best. Thus, in case where the bank insulating layer 110 has a low affinity to the organic gate insulating layer 134, when an organic insulating material solution is jetted to the first line hole 112 in the bank insulating layer 110, the organic insulating material solution moves away from the bank insulating layer 110 and selectively pools in the first line hole 112.

Alternatively, the surface of the bank insulating layer 110 may be plasma-processed to lower its affinity to the organic insulating layer or the organic semiconductor layer without forming the bank insulating layer 110 using the fluorine-based organic material layer. For the plasma process, a fluorine-based gas such as $CF_4$ or $SF_6$ is used. When the bank insulating layer is plasma-processed using the fluorine-based gas, the surface of the bank insulating layer is exposed to fluorine and the bank insulating layer's affinity to the organic insulating layer or the organic semiconductor layer is lowered.

In this exemplary embodiment of the present invention, the data line 104 is formed to be separated from the source electrode 132. That is, as shown in FIG. 2, the data line 104 is separated from the source electrode 132 by the bank insulating layer 110. This is to isolate the source electrode 132 in the second line hole 114 to selectively form the organic semiconductor layer on the source electrode 132. Here, the first contact portion 107 is formed for contact between the source electrode 132 and the data line 104. The first contact portion 107 is formed at the same height as the gate electrode 131, is connected to the source electrode 132 through the first contact hole 116, and is connected to the data line 104 through a third contact hole 118. The first and third contact holes 116 and 118 are formed at the same time that the first and second line holes 112 and 114 are formed in the bank insulating layer 110.

The drain electrode 133 is formed to be separated from the pixel electrode 106. That is, as shown in FIG. 2, the pixel electrode 106 is separated from the drain electrode 133 by the bank insulating layer 110. This is to isolate the drain electrode 133 in the second line hole 112 to selectively form the organic semiconductor layer 135 on the drain electrode 133 without the risk of the drain electrode 133 overflowing to the pixel electrode 106 during deposition. The drain electrode 133 is connected to the pixel electrode 106 through the second contact portion 108. The second contact portion 108 is formed at the same height as the gate electrode 131, is connected to the drain electrode 133 through the second contact hole 117, and is connected to the pixel electrode 106 through a fourth contact hole 119. The second and fourth contact holes 117 and 118 are formed at the same time that the first and second line holes 112 and 114 are formed in the bank insulating layer 110.

The pixel electrode 106 is formed of a transparent conductive material layer on a portion of the bank insulating layer 110 in each pixel region. In case where the source and drain electrodes 132 and 133 are formed of a transparent conductive material layer, the pixel electrode 106 is formed at the same time that the source and drain electrodes 132 and 133 are formed. The pixel electrode 106 is electrically connected to the drain electrode 133 through the second contact portion 108.

The pixel electrode 106 forms an electric field with a common electrode (not shown) to which a common voltage is applied when a video signal is supplied through the organic TFT 130. Liquid crystal molecules arranged between the organic TFT substrate and a color filter substrate are oriented by dielectric anisotropy in response to this electric field. Transmission of light through the pixel region depends on the orientation of the liquid crystal molecules. Therefore, gray scales can be realized.

A method for fabricating the organic TFT substrate according to the exemplary embodiment of the present invention is explained below with reference to FIGS. 3A to 7.

Figure 3A:
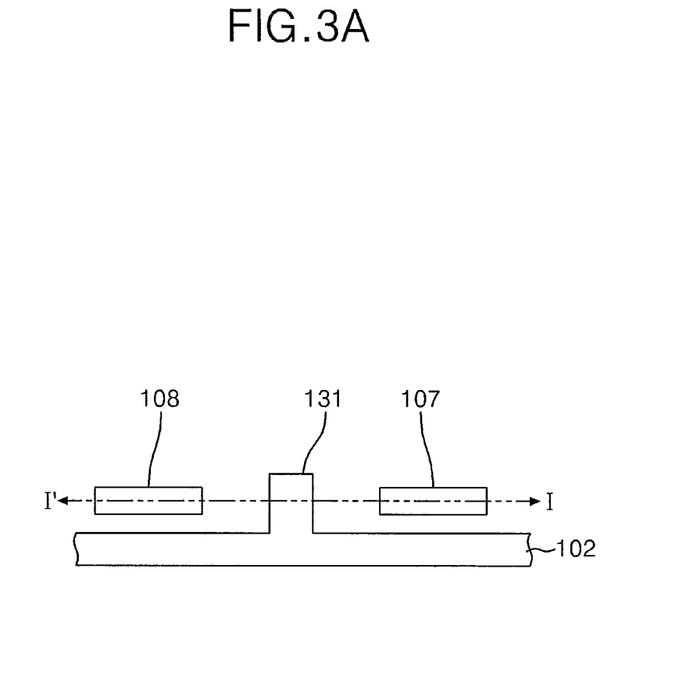
FIGS. 3A and 3B are a plan view and a cross-sectional view illustrating a process for forming a gate metal pattern and first and second contact portions according to an exemplary embodiment of the present invention.
Figure 3B:
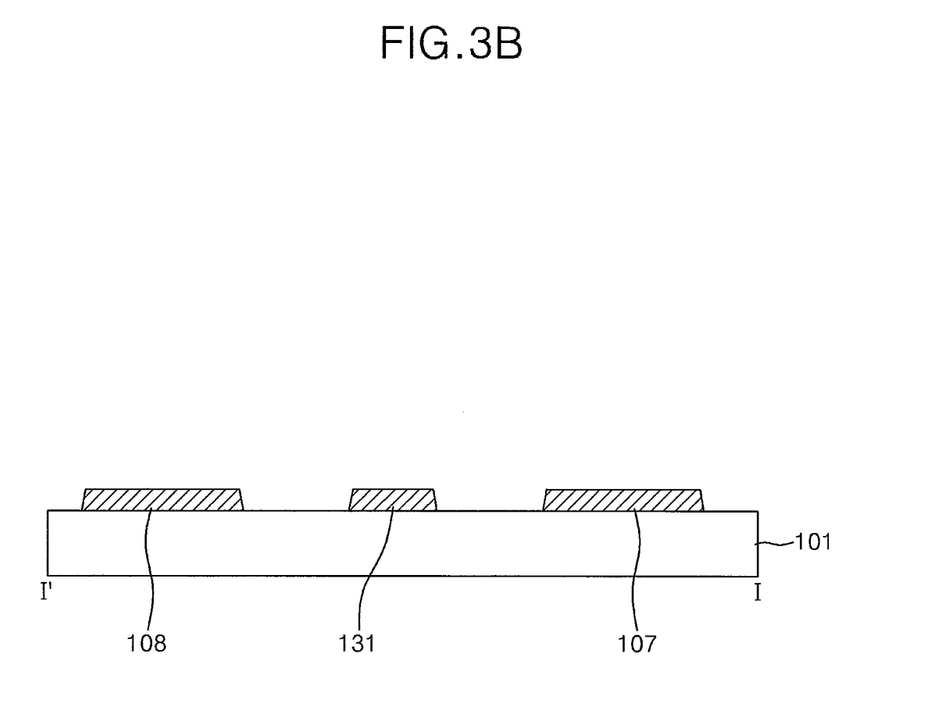

FIGS. 3A and 3B are a plan view and a cross-sectional view illustrating a process for forming a gate metal pattern and the first and second contact portions according to the exemplary embodiment of the present invention.

As shown in FIGS. 3A and 3B, a gate metal pattern including the gate line 102 and the gate electrode 131 and the first and second contact portions 107 and 108 are formed on the substrate 101 using a mask process.

In more detail, a gate metal layer is deposited on the substrate 101, and it is then patterned by photolithography and an etching process to form the gate metal pattern including the gate line 102 and the gate electrode 131 and the first and second contact portions 107 and 108 on the substrate 101. The gate metal layer may be made of molybdenum (Mo), titanium (Ti), copper (Cu), aluminum neodymium (AlNd), aluminum (Al), chromium (Cr), molybdenum alloy, copper alloy, and aluminum alloy. The gate metal layer may have a single-layer structure or a dual-layer structure. The first contact portion 107 is connected to the source electrode 132 and the data line 104 in a later process, and the second contact portion 108 is connected to the drain electrode 133 and the pixel electrode 106 in a later process. Thus, the first and second contact portions 107 and 108 are formed across the gate electrodes 131 from each other, and have a rectangular shape with the longer dimension extending parallel to the gate line 102.

Figure 4A:
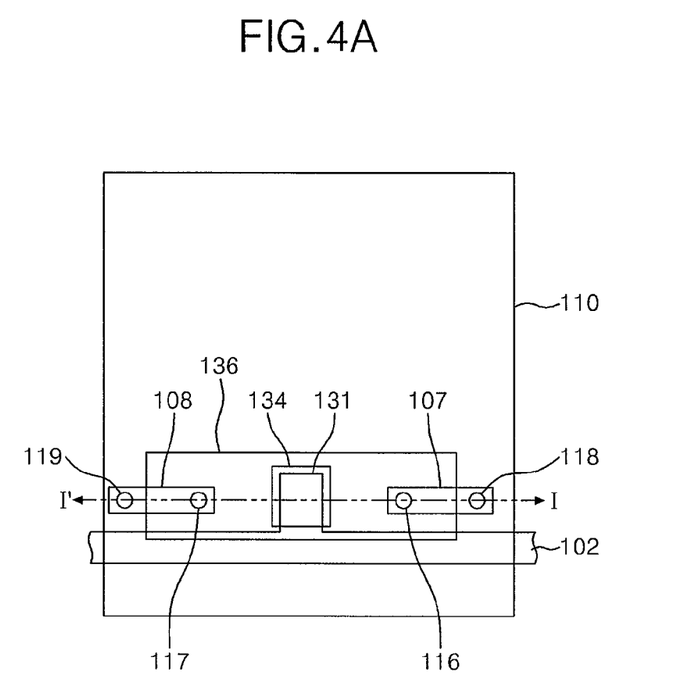
FIGS. 4A and 4B are a plan view and a cross-sectional view illustrating a process for forming a bank insulating layer according to an exemplary embodiment of the present invention.
Figure 4B:
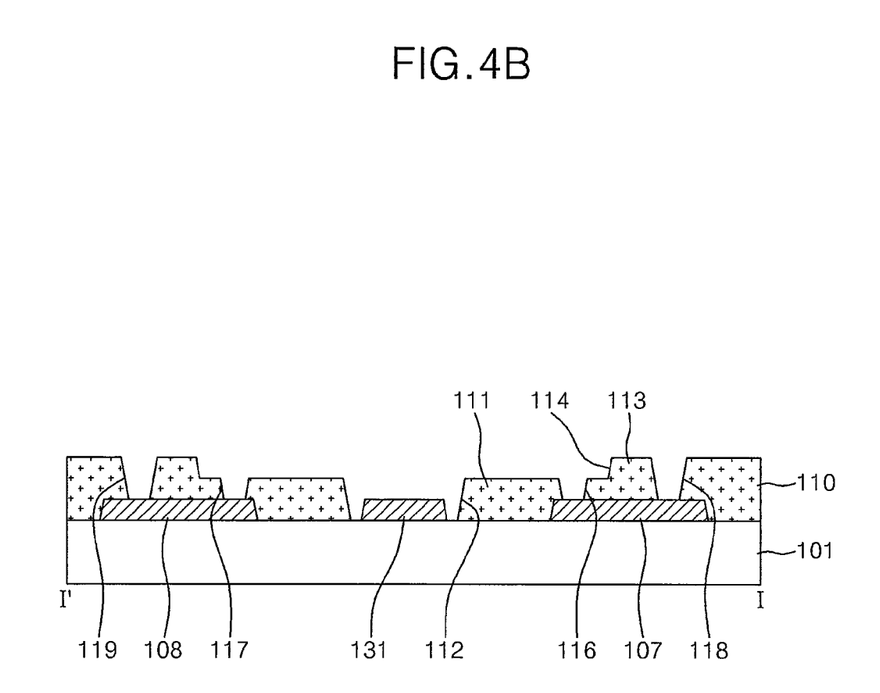
Figure 4C:
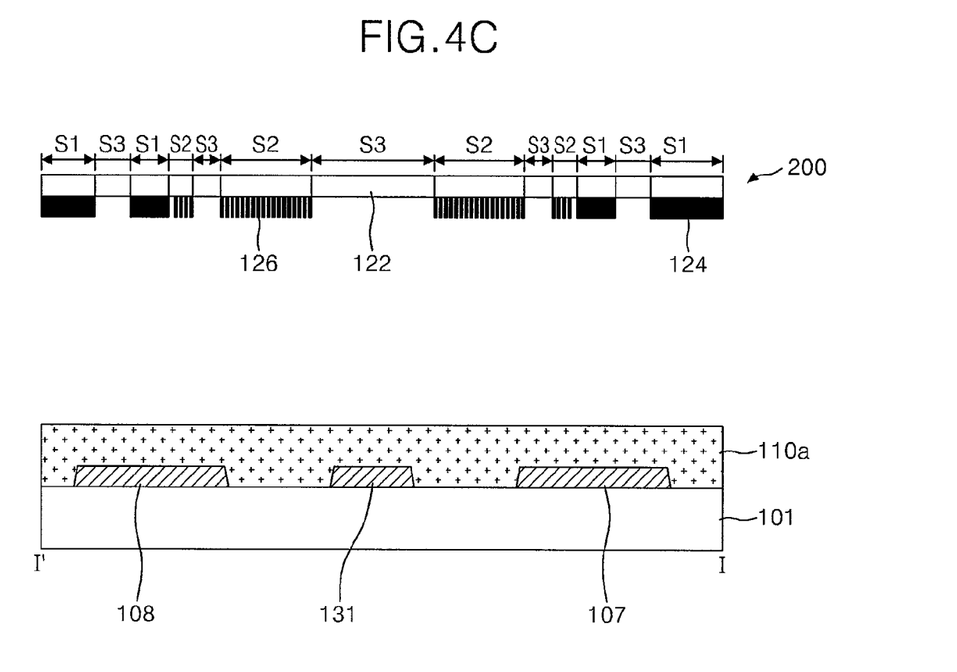
FIG. 4C is a cross-sectional view illustrating a process for forming step portions in the bank insulating layer according to an exemplary embodiment of the present invention.

FIGS. 4A and 4B are a plan view and a cross-sectional view illustrating a process for forming the bank insulating layer according to the exemplary embodiment of the present invention. FIG. 4c is a cross-sectional view illustrating a process for forming step portions in the bank insulating layer according to the exemplary embodiment of the present invention.

Referring to FIGS. 4A and 4B, a bank insulating layer pattern is formed on the substrate 101 having the gate metal pattern and the first and second contact portions 107 and 108.

The bank insulating layer pattern includes the first line hole 112 formed by the first sub bank 111, the second line hole 114 formed by the second sub bank 113, and the first to fourth contact holes 116 to 119. The first line hole 112 is formed around the gate electrode 131 to define a location at which the gate insulating layer 134 is to be formed. The first sub bank 111 for forming the first line hole 112 has a lower height than the second sub bank 113. "Height," as used herein, refers to the distance from the substrate 101 to the portion of an element that is farthest away from the substrate 101. The second line hole 114 has a rectangular shape and is formed to cover the general range between the first and second contact portions 107 and 108 and the gate electrode 131 and their peripheral region. The second sub bank 113 for forming the second line hole 114 is higher than the first sub bank 111 and defines a location at which the organic semiconductor layer 135 and the passivation layer 136 are to be formed.

The first to fourth contact holes 116, 117, 118, 119 are formed in the bank insulating layer 110 and extend to the first and second contact portions 107 and 108. The first contact hole 116 exposes one end of the first contact portion 107 adjacent to the gate electrode 131, and the third contact hole 118 exposes the other end of the first contact portion 107. The first contact hole 116 is formed in the second line hole 114, and the third contact hole 118 is formed outside the second line hole 114. The second contact hole 117 exposes one end of the second contact portion 108 adjacent to the gate electrode 131, and the fourth contact hole 119 exposes the other end of the second contact portion 108. The second contact hole 117 is formed in the second line hole 114, and the fourth contact hole 119 is formed outside the second line hole 114.

A procedure for forming the bank insulating layer having step portions is explained below in detail with reference to FIG. 4c.

Referring to FIG. 4c, a photosensitive organic insulating material 110a is coated on the substrate 101 having the gate metal layer pattern and the first and second contact portions by using a spin or spinless coating technique.

Subsequently, a slit mask 200 is aligned on the substrate 101. The slit mask 200 includes a shielding portion S1 in which a shielding layer 124 is formed on a quartz substrate 122, a slit portion S2 in which a plurality of slits 126 are formed on the quartz substrate 122, and a transmitting portion S3 in which only the quartz substrate 122 exists.

The shielding portion S1 shields the ultraviolet ray during a light exposure process to make the photosensitive organic insulating material 110a remain "as is" on a portion of the substrate 101 that is under the shielding portion S1, as shown in FIG. 4B.

The slit portion S2 diffracts the ultraviolet ray to weaken the intensity of the ultraviolet ray during the light exposure process. Thus, the photosensitive organic insulating material 110a remains at a predetermined height on portions of the substrate 101 that are under the slit portion S2, as shown in FIG. 4B. As a result, the portions of the remaining photosensitive organic insulating material 110a that are under the slit portion S2 have a lower height than the portion of the photosensitive organic insulating material 110a that is under the shielding portion S1. The second line hole 114, for example, is formed using the slit portion S2.

The transmitting portion S3 transmits all ultraviolet ray during the light exposure process, so that the portion of the photosensitive organic insulating material 110a that is under the transmitting region S3 is removed, as shown in FIG. 4B. As a result, the first line hole 112 and the first to fourth contact holes 116 to 119 are formed on portions of the substrate 101 corresponding to the transmitting portion S3. Here, the first line hole 112 is formed to extend parallel to the gate line 102, and it is narrower in width and shorter in length than the second line hole 114. The first line hole 112 exposes just the gate electrode 131.

Alternatively, the bank insulating layer 110 having the step portions of FIG. 4B may be formed by using a half tone mask.

Figure 5:
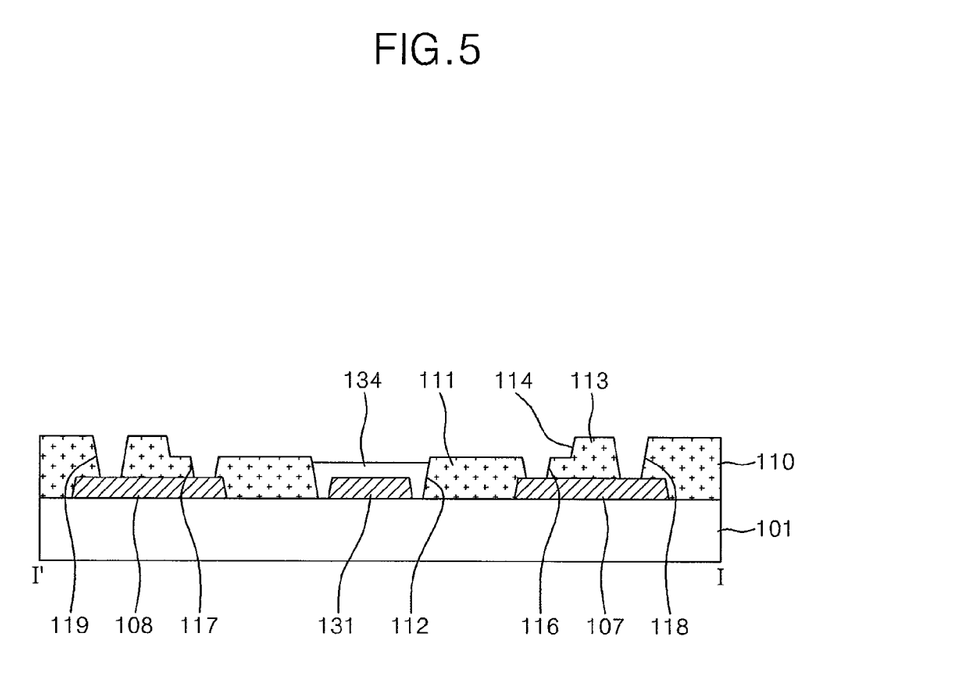
FIG. 5 is a cross-sectional view illustrating a process for forming a gate insulating layer according to an exemplary embodiment of the present invention.

FIG. 5 is a cross-sectional view illustrating a process for forming the gate insulating layer according to an exemplary embodiment of the present invention. Referring to FIG. 5, an organic insulating solution is jetted in the first line hole 112 formed by the first sub bank 111 by using an ink jet device and then hardened to form the gate insulating layer 134. Since the organic semiconductor layer 135 is used as the active layer of the organic TFT 130, it is preferable that the gate insulating layer 134 contacting the organic semiconductor layer 135 is formed of the organic insulating material. Preferably, the organic gate insulating layer 134 is made of an organic insulating material such as polyvinyl pyrrolidone (PVP), polymethylmethacrylate (PMMA), benzocyclobutene (BCB), polyimide, polyvinylphenol, and parylene.

Before jetting the organic insulating solution, the substrate 101 having the bank insulating layer 110 may be plasma-processed. Due to the plasma process, the portions exposed by the first line hole 112 have a high affinity to the organic insulating solution, and the remaining portions have a low affinity. Thereafter, when the organic insulating solution is jetted onto the substrate 101, the organic insulating solution accumulates in the portions exposed by the first line hole 112 that have a higher affinity to the organic insulating solution, so that the organic gate insulating layer 134 is formed in the first line hole 112, preventing the overflow phenomenon of the organic insulating layer 134. Since the size of a drop of the organic insulating solution jetted by the ink jet device is equal to or larger than the first line hole 112, it is difficult to selectively form the gate insulating layer 134 only in the first line hole 112 without using the plasma process.

Alternatively, the bank insulating layer 110 may be made of a material having a low affinity to the organic insulating solution. For example, the bank insulating layer 110 may be made of an insulating material having fluorine. In this instance, when the organic insulating solution is jetted onto the substrate 101 having the bank insulating layer 110, the organic insulating solution accumulates in the portions exposed by the first line hole 112, thereby forming the organic gate insulating layer 134 primarily in the first line hole 112.

Figure 6A:
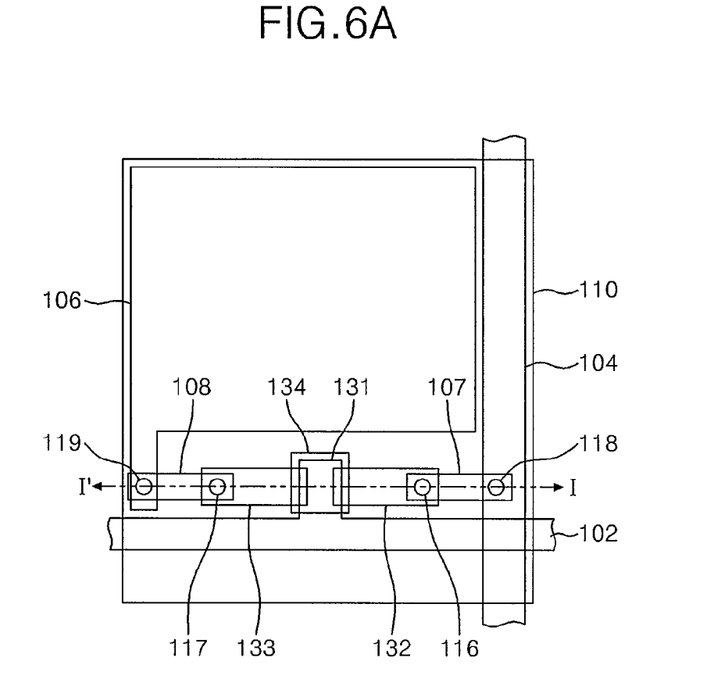
FIGS. 6A and 6B are a plan view and a cross-sectional view illustrating a process for forming a source/drain metal pattern and a pixel electrode according to an exemplary embodiment of the present invention.
Figure 6B:
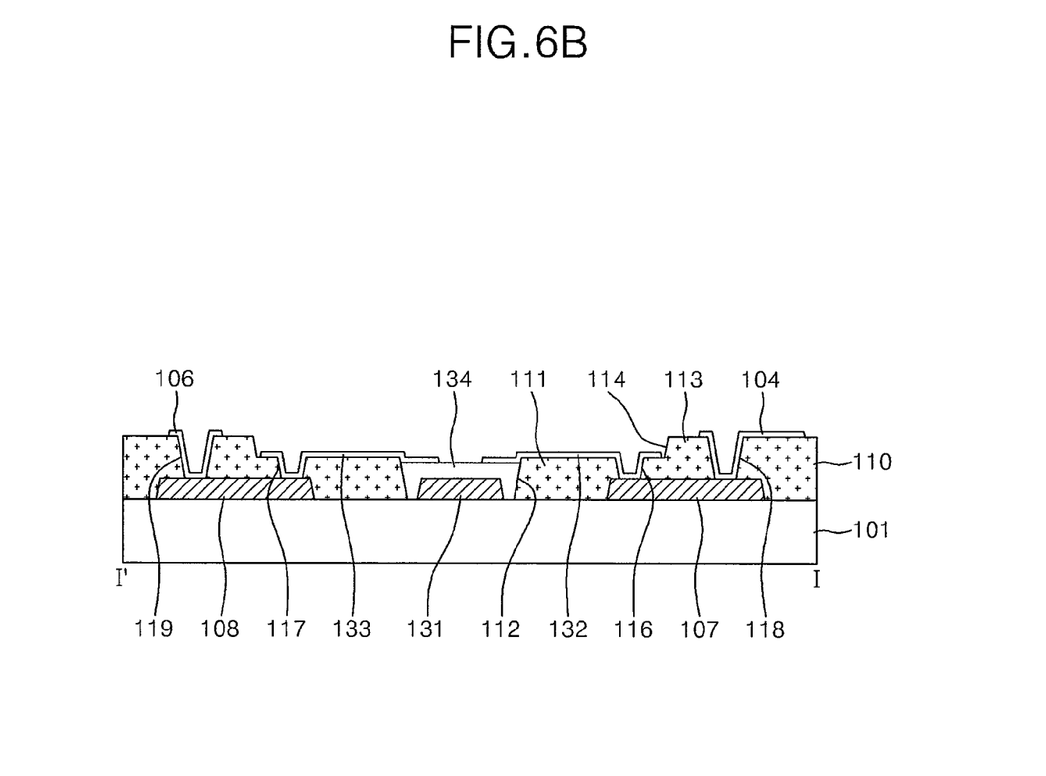

FIGS. 6A and 6B are a plan view and a cross-sectional view illustrating a process for forming a source/drain metal pattern and the pixel electrode according to an exemplary embodiment of the present invention.

Referring to FIGS. 6A and 6B, a source/drain metal pattern having the data line 104 and the source and drain electrodes 132 and 133 and the pixel electrode 106 are formed on the substrate 101 having the organic gate insulating layer 134.

The source and drain electrodes 132 and 133 are formed to be isolated in the second line hole 114, and the data line 104 and the pixel electrode 106 are formed outside of the second line hole 114, as shown in FIG. 6b. Thus, the source electrode 132 is formed separated from the data line 104, and the drain electrode 133 is formed separated from the pixel electrode 106.

The source electrode 132 is formed parallel to the gate line 102 so that one end lies over the gate electrode 131 and the other end lies over the first contact portion 107. The latter end of the source electrode 132 is connected to the first contact portion 107 through the first contact hole 116. The drain electrode 133 is formed parallel to the gate line 102 so that one end lies over the gate electrode 131 and the other end lies over the second contact portion 108. The other end of the drain electrode 133 is connected to the second contact portion 108 through the second contact hole 117.

The data line 104 is formed substantially perpendicularly to the gate line 102, and is formed outside of the second line hole 114. The data line 104 is connected to the first contact portion 107 through the third contact hole 118, so that the data line 104 is electrically connected to the source electrode 132 via the first contact portion 107.

The pixel electrode 106 is formed to cover a portion of the pixel region excluding a region in which the organic TFT 130 is formed, as shown in FIG. 6A. The pixel electrode 106 is formed outside of the second line hole 114 to be separated from the drain electrode 133. One end of the pixel electrode 106 is connected to the second contact portion 108 through the fourth contact hole 119, so that the pixel electrode 106 is electrically connected to the drain electrode 133 via the second contact portion 108.

Figure 7:
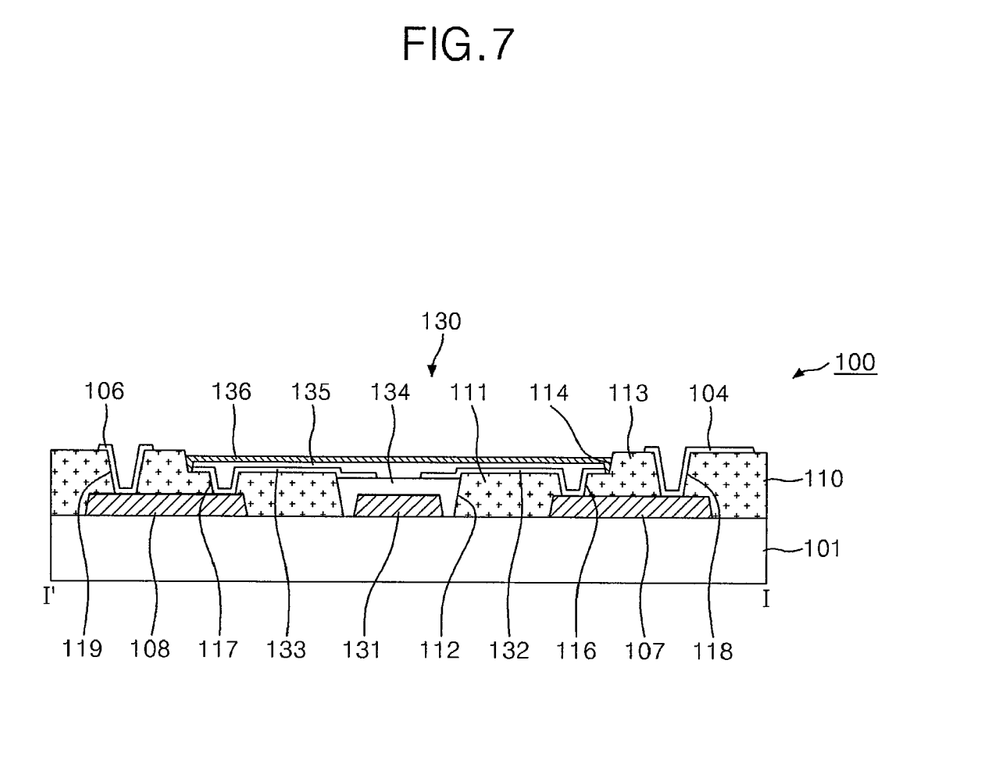
FIG. 7 is a cross-sectional view illustrating a process for forming an organic semiconductor layer and a passivation layer according to an exemplary embodiment of the present invention.

FIG. 7 is a cross-sectional view illustrating a process for forming the organic semiconductor layer and the passivation layer according to the exemplary embodiment of the present invention.

Referring to FIG. 7, an organic semiconductor solution is jetted into the second line hole 114 by using an ink jet device, so that the organic semiconductor solution is gathered in the second line hole 114 by the second sub bank 113. Thereafter, the organic semiconductor solution is hardened to thereby form the organic semiconductor layer 135.

Before jetting the organic semiconductor solution, the substrate 101 having the source/drain metal pattern and the bank insulating layer 110 may be plasma-processed. Due to the plasma process, the portions exposed by the second line hole 114 that are defined by the second sub bank 113 have a high affinity to the organic semiconductor solution, and the remaining portions have a low affinity to the organic semiconductor solution. After the plasma process, when the organic semiconductor solution is jetted onto the substrate 101, the organic semiconductor solution accumulates in the source and drain electrodes 132 and 133 and the gate insulating layer 134 which have a high affinity to the organic semiconductor solution. Therefore, the organic semiconductor layer 135 is selectively formed on the source and drain electrode 132 and the gate insulating layer 134, preventing the organic semiconductor layer 135 from overflowing. A fluorine-based gas such as $CF_4$ and $SF_6$ is preferably used for the plasma process.

Alternatively, the bank insulating layer 110 may be made of a material having a low affinity to the organic semiconductor solution. In this instance, the organic semiconductor solution accumulates on the source and drain electrodes 132 and 133 and the gate insulating layer 134, which have a relatively high affinity to the organic semiconductor solution. This way, the organic semiconductor layer 135 is prevented from overflowing.

After forming the organic semiconductor layer 135, the passivation layer 136 is formed in the second line hole 114. That is, as shown in FIG. 7, the passivation layer 136 is formed such that an organic passivation layer solution such as poly vinyl alcohol (PVA) is jetted into the second line hole 114 defined by the second sub bank 113 by an ink jet device and then hardened. A location at which the organic passivation layer 136 is to be formed is defined by the second sub bank 113. That is, the organic passivation layer 136 is formed to cover the organic TFT 130 and the peripheral region of the organic TFT 130.

The organic TFT substrate and the method for fabricating the organic TFT substrate according to the present invention have the following advantages. First, locations of the gate insulating layer, the organic semiconductor layer and the passivation layer are exactly defined by the first and second sub banks formed in the single bank insulating layer, and the fabricating process is simple.

Further, the data line and the pixel electrode are formed respectively separated from the source electrode and the drain electrode by the second sub bank, thereby preventing the organic semiconductor layer from overflowing onto the pixel electrode or the data line.

Furthermore, since the source and drain electrodes are formed of a transparent conductive material layer, the photoelectric current flows to the organic semiconductor layer, thereby reducing the contact resistance between the organic semiconductor layer and the source and drain electrodes.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic thin film transistor (TFT) substrate, comprising:
    a gate line formed on a base substrate;
    a data line formed substantially perpendicularly to the gate line, the gate line defining a pixel region together with the data line;
    an organic TFT comprising a gate electrode connected to the gate line, a source electrode connected to the data line, and a drain electrode;
    a first contact part making contact with the data line and the source electrode to connect the data line to the source electrode, wherein the first contact part is disposed between the data line and the base substrate;
    a pixel electrode formed in the pixel region;
    a second contact part making contact with the pixel electrode and the drain electrode to connect the pixel electrode to the drain electrode; and
    a bank insulating layer including a first contact hole through which the first contact part is connected to the organic TFT and a second contact hole through which the second contact part is connected to the organic TFT,
    wherein the organic TFT comprises:
        a gate insulating layer formed on the gate electrode;
        an organic semiconductor layer formed on the gate insulating layer, the source electrode, and the drain electrode, wherein at least a portion of the source electrode is disposed between the organic semiconductor layer and the first contact part; and
        a passivation layer formed to cover the organic TFT and a peripheral region of the organic TFT, wherein at least a portion of the organic semiconductor layer is disposed between the passivation layer and the source electrode,
    wherein the bank insulating layer comprises a first sub bank defining a location of the gate insulating layer, and a second sub bank defining a location of the passivation layer,
    wherein the first sub bank defines a line hole limiting the position of the gate insulating layer to expose the gate electrode and a peripheral region of the gate electrode, and
    wherein a region of the gate electrode and the peripheral region of the gate electrode exposed by the line hole has a relatively high affinity to the gate insulating layer, and the first sub bank has a relatively low affinity to the gate insulating layer.

2. The organic TFT substrate of claim 1, wherein the bank insulating layer is formed of an organic insulating material containing fluorine.

3. The organic TFT substrate of claim 1, wherein the source and drain electrodes have a relatively high affinity to the organic semiconductor layer, and the bank insulating layer has a relatively low affinity to the organic semiconductor layer.

4. The organic TFT substrate of claim 1, wherein the source and drain electrodes are formed of a transparent conductive material.

5. The organic TFT substrate of claim 1, wherein the first contact part is made of a different layer from the source electrode.

6. The organic TFT substrate of claim 1, wherein at least one of the first and second contact holes has a depth that is substantially equal to a thickness of the bank insulating layer.

7. The organic TFT substrate of claim 1, wherein the first contact part and the second contact part are formed of the same layer as the gate electrode.

8. The organic TFT substrate of claim 1, wherein affinity of the bank insulating layer to the passivation layer is lower than affinity of the organic TFT to the passivation layer.

9. The organic TFT substrate of claim 1, wherein the gate electrode is disposed inside the line hole.

10. An organic thin film transistor (TFT) substrate, comprising:
  a gate line formed on a base substrate;
  a data line formed substantially perpendicularly to the gate line, the gate line defining a pixel region together with the data line;
  an organic TFT comprising a gate electrode connected to the gate line, a source electrode connected to the data line, and a drain electrode;
  a first contact part making contact with the data line and the source electrode to connect the data line to the source electrode, wherein the first contact part is disposed between the data line and the base substrate;
  a pixel electrode formed in the pixel region;
  a second contact part making contact with the pixel electrode and the drain electrode to connect the pixel electrode to the drain electrode; and
  a bank insulating layer including a first contact hole through which the first contact part is connected to the organic TFT and a second contact hole through which the second contact part is connected to the organic TFT,
  wherein the organic TFT comprises:
    a gate insulating layer formed on the gate electrode;
    an organic semiconductor layer formed on the gate insulating layer, the source electrode, and the drain electrode, wherein at least a portion of the source electrode is disposed between the organic semiconductor layer and the first contact part; and
    a passivation layer formed to cover the organic TFT and a peripheral region of the organic TFT, wherein at least a portion of the organic semiconductor layer is disposed between the passivation layer and the source electrode,
    wherein the bank insulating layer comprises a first sub bank defining a location of the gate insulating layer, and a second sub bank defining a location of the passivation layer,
    wherein the second sub bank is higher than the first sub bank and defines a line hole limiting the position of the passivation layer and exposing the organic TFT and a peripheral region of the organic TFT, and
    wherein a region of the organic TFT and the peripheral region of the organic TFT exposed by the line hole has a high affinity to the passivation layer, and the second sub bank has a low affinity to the passivation layer.

11. The organic TFT substrate of claim 1, wherein the bank insulating layer is formed of an organic insulating material containing fluorine.

12. The organic TFT substrate of claim 10, wherein the source and drain electrodes have a relatively high affinity to the organic semiconductor layer, and the bank insulating layer has a relatively low affinity to the organic semiconductor layer.

13. The organic TFT substrate of claim 10, wherein the source and drain electrodes are formed of a transparent conductive material.

14. The organic TFT substrate of claim 10, wherein the first contact part is made of a different layer from the source electrode.

15. The organic TFT substrate of claim 10, wherein at least one of the first and second contact holes has a depth that is substantially equal to a thickness of the bank insulating layer.

16. The organic TFT substrate of claim 10, wherein the first contact part and the second contact part are formed of the same layer as the gate electrode.

17. The organic TFT substrate of claim 10, wherein affinity of the bank insulating layer to the passivation layer is lower than affinity of the organic TFT to the passivation layer.

18. The organic TFT substrate of claim 10, wherein the passivation layer is disposed inside the line hole.

19. An organic thin film transistor (TFT) substrate, comprising:
  a gate line formed on a base substrate;
  a data line formed substantially perpendicularly to the gate line, the gate line defining a pixel region together with the data line;
  an organic TFT comprising a gate electrode contacting the base substrate and connected to the gate line, a source electrode connected to the data line, and a drain electrode;
  a first contact part making contact with the data line and the source electrode to connect the data line to the source electrode, wherein the first contact part is disposed between the data line and the base substrate;
  a pixel electrode formed in the pixel region;
  a second contact part making contact with the pixel electrode and the drain electrode to connect the pixel electrode to the drain electrode; and
  a bank insulating layer including a first contact hole through which the first contact part is connected to the organic TFT and a second contact hole through which the second contact part is connected to the organic TFT,
  wherein the organic TFT further comprises
    a gate insulating layer formed on the gate electrode; and
    an organic semiconductor layer formed on the gate insulating layer, the source electrode, and the drain electrode, wherein at least a portion of the source electrode is disposed between the organic semiconductor layer and the first contact part,
  wherein affinity of the bank insulating layer to the gate insulating layer is lower than affinity of the gate electrode to the gate insulating layer.

20. An organic thin film transistor (TFT) substrate, comprising:
  a gate line formed on a base substrate;

a data line formed substantially perpendicularly to the gate line, the gate line defining a pixel region together with the data line;

an organic TFT comprising a gate electrode contacting the base substrate and connected to the gate line, a source electrode connected to the data line, and a drain electrode;

a first contact part making contact with the data line and the source electrode to connect the data line to the source electrode, wherein the first contact part is disposed between the data line and the base substrate;

a pixel electrode formed in the pixel region;

a second contact part making contact with the pixel electrode and the drain electrode to connect the pixel electrode to the drain electrode; and a bank insulating layer including a first contact hole through which the first contact part is connected to the organic TFT and a second contact hole through which the second contact part is connected to the organic TFT, wherein the organic TFT further comprises a gate insulating layer formed on the gate electrode; and an organic semiconductor layer formed on the gate insulating layer, the source electrode, and the drain electrode, wherein at least a portion of the source electrode is disposed between the organic semiconductor layer and the first contact part, wherein affinity of the bank insulating layer to the organic semiconductor layer is lower than affinity of the gate electrode to the organic semiconductor layer.

* * * * *